(12) United States Patent
Anderson et al.

(10) Patent No.: US 7,537,985 B2
(45) Date of Patent: May 26, 2009

(54) DOUBLE GATE ISOLATION

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 11/830,872

(22) Filed: Jul. 31, 2007

(65) Prior Publication Data
US 2007/0269950 A1 Nov. 22, 2007

Related U.S. Application Data

(62) Division of application No. 10/906,547, filed on Feb. 24, 2005, now Pat. No. 7,288,805.

(51) Int. Cl.
*H01L 21/44* (2006.01)
(52) U.S. Cl. .............. 438/176; 438/157; 438/164; 438/198; 438/283; 438/294; 257/E21.014; 257/E21.415; 257/E21.442; 257/E21.444; 257/E21.635; 257/E29.056; 257/E29.137; 257/E21.151; 257/E29.275
(58) Field of Classification Search ............... 438/157, 438/164, 176, 198, 218, 283, 294, 410; 257/E21.014, 257/415, 442, 444, 635, E29.056, 137, 151, 257/275
See application file for complete search history.

(56) References Cited

U.S. PATENT DOCUMENTS

| | | | |
|---|---|---|---|
| 6,121,658 | A | 9/2000 | Houston |
| 6,254,794 | B1 | 7/2001 | Sakaguchi et al. |
| 6,342,717 | B1 | 1/2002 | Komatsu |
| 6,396,108 | B1 | 5/2002 | Krivokapic et al. |
| 6,413,802 | B1 | 7/2002 | Hu et al. |

(Continued)

FOREIGN PATENT DOCUMENTS

DE 101 19411 A1 11/2001

(Continued)

OTHER PUBLICATIONS

Fried, et al., "A Fin-Type Independent-Double-Gate NFET", 2 pages.

(Continued)

*Primary Examiner*—Michael S Lebentritt
(74) *Attorney, Agent, or Firm*—Gibb I.P. Law Firm, LLC; Richard M. Kotulak, Esq

(57) ABSTRACT

A double-gated fin-type field effect transistor (FinFET) structure has electrically isolated gates. In a method for manufacturing the FinFET structure, a fin, having a gate dielectric on each sidewall corresponding to the central channel region, is formed over a buried oxide (BOX) layer on a substrate. Independent first and second gate conductors on either sidewall of the fin are formed and include symmetric multiple layers of conductive material. An insulator is formed above the fin by either oxidizing conductive material deposited on the fin or by removing conductive material deposited on the fin and filling in the resulting space with an insulating material. An insulating layer is deposited over the gate conductors and the insulator. A first gate contact opening is etched in the insulating layer above the first gate. A second gate contact opening is etched in the BOX layer below the second gate.

9 Claims, 17 Drawing Sheets

U.S. PATENT DOCUMENTS

| | | | |
|---|---|---|---|
| 6,492,212 | B1 | 12/2002 | Ieong et al. |
| 6,525,403 | B2 * | 2/2003 | Inaba et al. ............... 257/618 |
| 6,611,029 | B1 | 8/2003 | Ahmed et al. |
| 6,642,090 | B1 * | 11/2003 | Fried et al. ............... 438/164 |
| 6,657,252 | B2 | 12/2003 | Fried et al. |
| 6,787,404 | B1 | 9/2004 | Lee et al. |
| 7,045,401 | B2 * | 5/2006 | Lee et al. ............... 438/157 |
| 7,166,895 | B2 * | 1/2007 | Saito ............... 257/347 |
| 7,288,805 | B2 * | 10/2007 | Anderson et al. ............ 257/250 |
| 7,297,600 | B2 * | 11/2007 | Oh et al. ............... 438/283 |
| 7,323,373 | B2 * | 1/2008 | Mathew et al. ............ 438/156 |
| 2003/0113961 | A1 | 6/2003 | Horiuchi et al. |
| 2003/0151077 | A1 * | 8/2003 | Mathew et al. ............ 257/250 |
| 2003/0178677 | A1 | 9/2003 | Clark et al. |
| 2003/0193065 | A1 | 10/2003 | Fried et al. |
| 2004/0169269 | A1 | 9/2004 | Yeo et al. |
| 2004/0198031 | A1 | 10/2004 | Lin et al. |

FOREIGN PATENT DOCUMENTS

| | | |
|---|---|---|
| IE | 20010380 | 2/2002 |
| JP | 2002-016255 A | 1/2002 |

OTHER PUBLICATIONS

Fried et al., "High-Performance P-Type Independent-Gate FinFETs", IEEE Electron Device Letters, vol. 25, No. 4, Apr. 2004, pp. 199-201.

Fried, et al., "Improved Independent Gate N-Type FinFET Fabrication and Characterization", IEEE Electron Device Letters, vol. 24, No. 9, Sep. 2003, pp. 592-594.

* cited by examiner

DOUBLE GATE ISOLATION

CROSS-REFERENCE TO RELATED APPLICATIONS

This application is a divisional of U.S. application Ser. No. 10/906,547 filed Feb. 24, 2005, now U.S. Pat. No. 7,288,805 the complete disclosure of which, in its entirety, is herein incorporated by reference.

BACKGROUND OF THE INVENTION

1. Field of the Invention

The invention generally relates to a fin-type field effect transistor (FinFET), and more particularly, to a double-gated FinFET structure having electrically isolated gates and a method for manufacturing the double-gated FinFET structure.

2. Description of the Related Art

As transistor design is improved and evolves, the number of different types of transistors continues to increase. A fin-type field effect transistor (FinFET) is a type of transistor that has a fin, containing a channel region and source and drain regions. A double-gated FinFET is a FinFET with first and second gate conductors on either sidewall of the fin. The gate conductors cover the channel region of the fin, whereas the source and drain regions of the fin extend beyond the coverage of the gate conductors. FinFETs are discussed at length in U.S. Pat. No. 6,413,802 to Hu et al. (hereinafter "Hu"), which is incorporated herein by reference. Certain circuit applications, including equivalent well-bias control, multiple threshold Complimentary Metal Oxide Semiconductor (CMOS) structures and analog circuits, can benefit from having independently controlled gates on the same FinFET. Additionally, using one gate to adjust threshold voltage will allow device designers to avoid the dopant fluctuation scaling limit. In order to independently control the first and second gates of a doubled-gated FinFET, the gates must be isolated. Isolating the first and second gates can be difficult.

SUMMARY OF THE INVENTION

In view of the foregoing, the present invention is a double-gated FinFET structure having isolated independent gates and a method for manufacturing the double-gated FinFET structure. An embodiment of the structure of the present invention comprises a double-gated FinFET. The FinFET structure comprises a fin having a source region on one end, a central channel region, and a drain region on the opposite end. The fin further comprises two opposing sidewalls (i.e., a first sidewall and a second sidewall), extending from end to end. The sidewalls both comprise a gate dielectric on portions corresponding to the central channel region of the fin. A first gate conductor is on the first sidewall of the fin in an area corresponding to the central channel region. A second gate conductor is on the second sidewall of the fin in an area corresponding to the central channel region. An insulator is above the fin, over an area corresponding to the central channel region. The insulator electrically separates the first gate conductor from the second gate conductor.

Both the first and second gate conductors of the FinFET structure comprise symmetric multiple layers of conductive material. In forming the structure, a portion of one of or more of the multiple layers of conductive material is positioned over the fin in the area corresponding to the channel region and is either converted into the insulator or removed and replaced with an insulator. The multiple layers of conductive material for both the first and second gate conductors comprise two or more symmetric conductive layers, depending upon the embodiment.

In one embodiment the multiple layers of conductive material comprise a first conductive layer that is a conductive sidewall spacer on the gate dielectric on both sidewalls of the fin, a second conductive layer that is on the first conductive layer and is formed of a material that is capable of being converted into an insulating material, and third conductive layer that is on the second conductive layer. In another embodiment the multiple layers of conductive material comprise a first conductive layer that is a conductive sidewall spacer on the gate dielectric and has an implanted top surface that is capable of being converted into an insulating material, and a second conductive layer.

The insulator of this embodiment of the structure of the present invention is positioned above the fin in an area corresponding to the central channel region. The insulator comprises a portion of the multiple layers of conductive material. It can comprise an insulating material converted from a portion of the conductive material capable of being converted into an insulating material. This portion of the conductive material can be oxidized thereby converting it into an insulating material. Alternatively, adjacent portions of the first and second gate conductors that are positioned above the fin can be removed and replaced with an insulating material.

An embodiment of the method of the present invention for manufacturing a double-gated FinFET, having isolated independent gates, comprises forming gates on both sides of the fin of a FinFET device with an insulator above the fin separating the gates. More specifically, a fin is formed and positioned on an insulating layer. The fin comprises a central channel region, end portions (source and drain regions), and opposing sidewalls (first and second sidewalls). Portions of the first and second sidewalls of the fin comprise a gate dielectric corresponding to the central channel region.

A first conductive layer is formed on the portions of the first and second sidewall of the fin corresponding to the central channel region. A gate contact opening is etched into the insulating layer on which the fin is positioned. A second conductive layer is then formed over the fin and the first conductive layer. The second conductive layer can comprise a conductive material capable of being converted into an insulator by oxidizing the conductive material. This conductive material capable of being converted into an insulator can be a different material from that of the first conductive layer such that forming the second conductive layer is accomplished by deposited the different conductive material over the first conductive layer and the fin. Alternatively, the process of forming a second conductive layer over the fin and the first conductive layer can comprise further forming the first conductive layer over the fin and then implanting the outer surface of the first conductive layer with an impurity. The impurity should be in sufficient concentrations to enhance the oxidation of the outer surface of the first conductive layer such that it is converted into the conductive material capable of being converted into an insulating material by oxidizing the conductive material. A third conductive layer is then deposited over the second conductive layer. The third conductive layer is planed down to expose a portion of the second conductive layer that is above the fin. This exposed portion of the second conductive layer is then changed into an insulator either by oxidizing the exposed portion of the second conductive layer or by selectively removing the exposed portion of the second conductive layer and filling in the removed portions of the second conductive layer with an insulator.

These and other aspects of embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the embodiments of the invention without departing from the spirit thereof, and the invention includes all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS OF THE INVENTION

Figure 1:
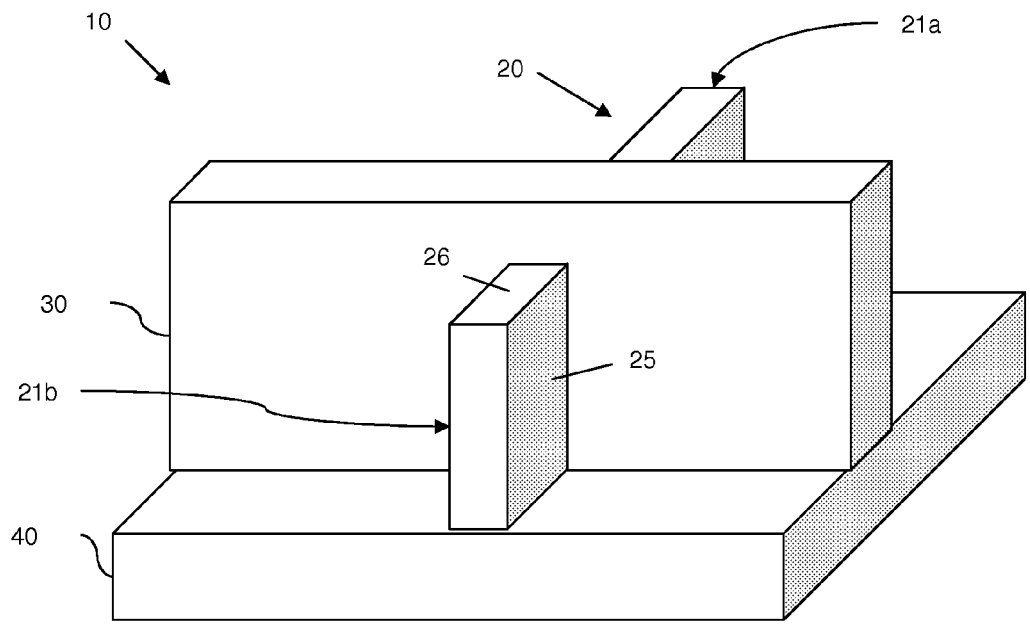
FIG. 1 is a schematic perspective-view diagram of a FinFET structure.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the invention.

As stated above, certain circuit applications, including equivalent well-bias control, multiple threshold Complimentary Metal Oxide Semiconductor (CMOS) structures, and analog circuits, can benefit from having independently controlled gates on the same FinFET. Additionally, independently controlling one gate of a double-gated FinFET to adjust threshold voltage will allow device designers to avoid the dopant fluctuation scaling limit. In order to independently control the first and second gates of a doubled-gated FinFETs, the gates must be isolated. The present invention is a double-gated FinFET structure 100 having electrically isolated independent gates and a method for manufacturing the double-gated FinFET structure. The structure of the present invention comprises a double-gated FinFET, complete embodiments of which are illustrated in FIGS. 14, 17, 27 and 30. The embodiments of the method of the present invention are illustrated in flow diagrams of FIGS. 31-32.

Figure 2:
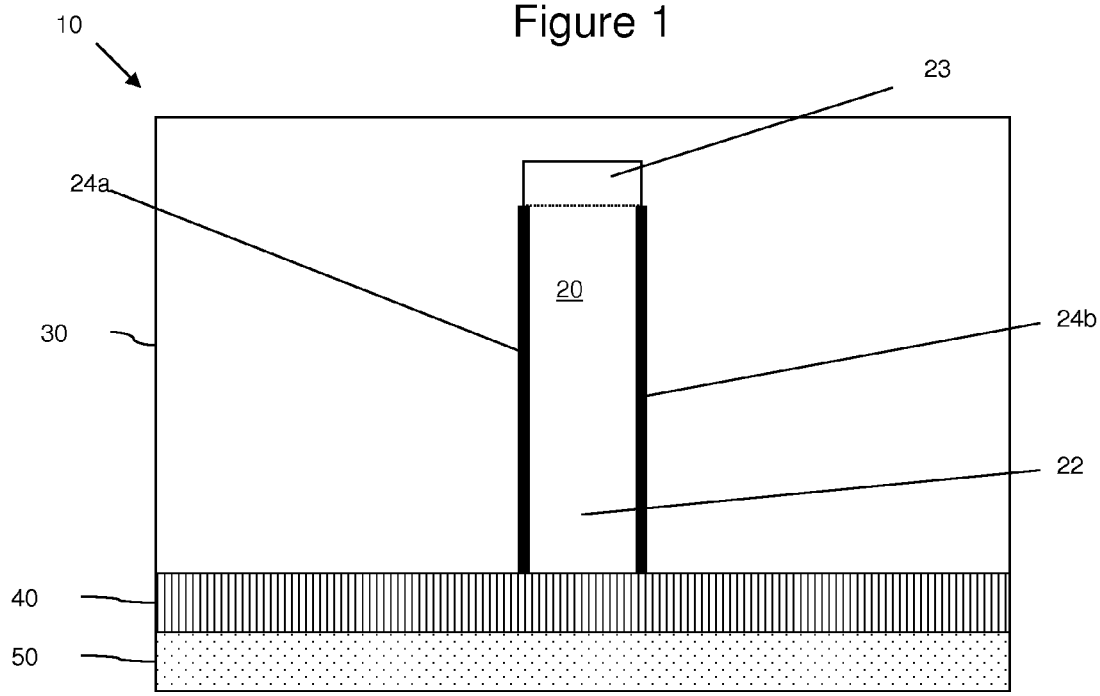
FIG. 2 is a schematic cross-sectional view diagram of a FinFET structure.
Figure 3:
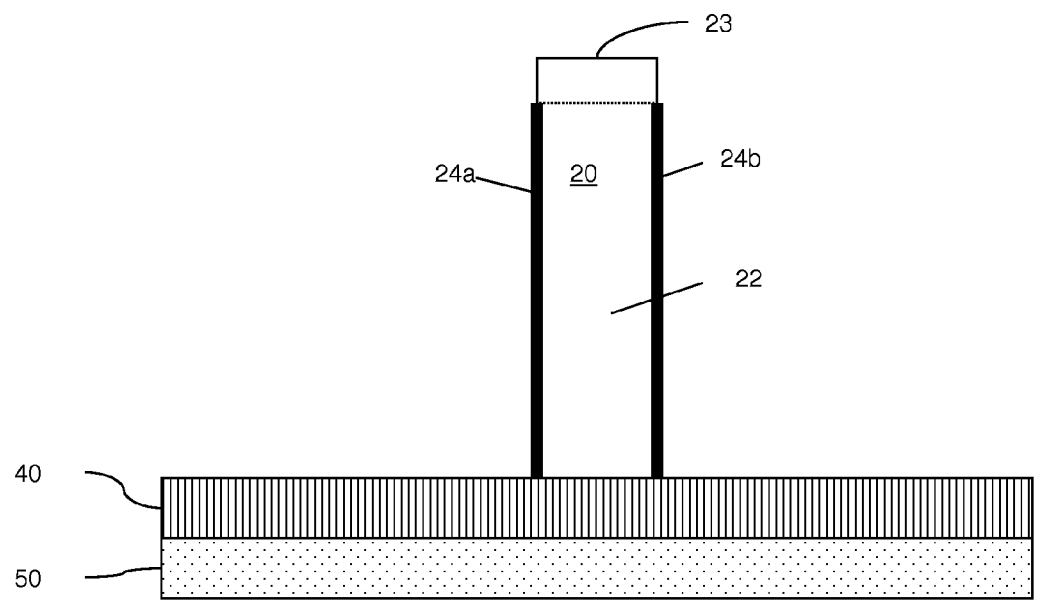
FIG. 3 is a schematic cross-sectional view diagram of a partially completed FinFET.
Figure 4:
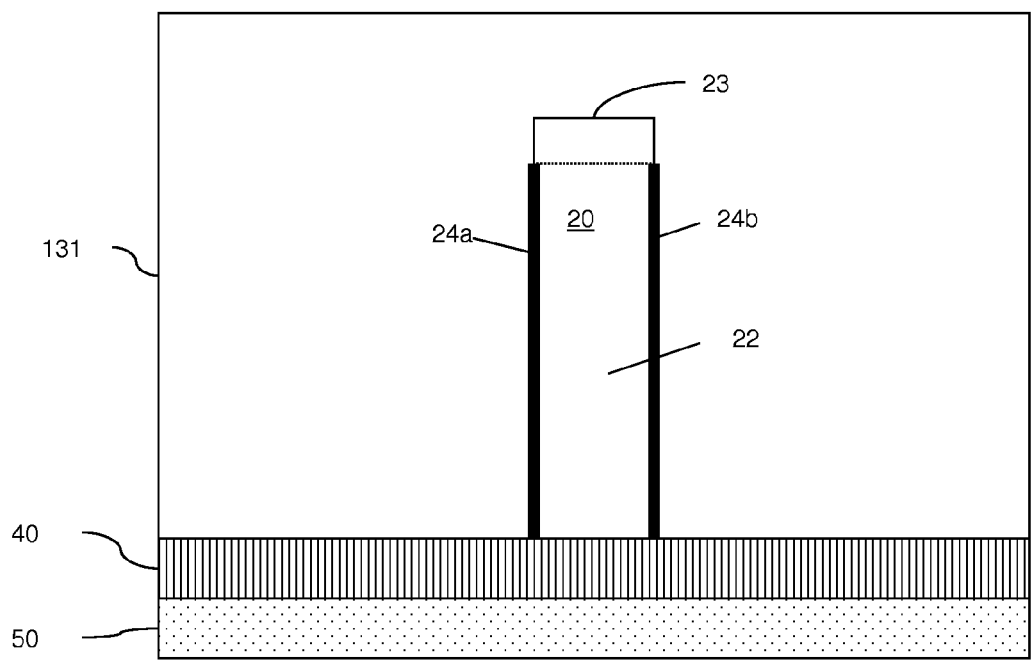
FIG. 4 is a schematic cross-sectional view diagram of a partially completed FinFET.
Figure 5:
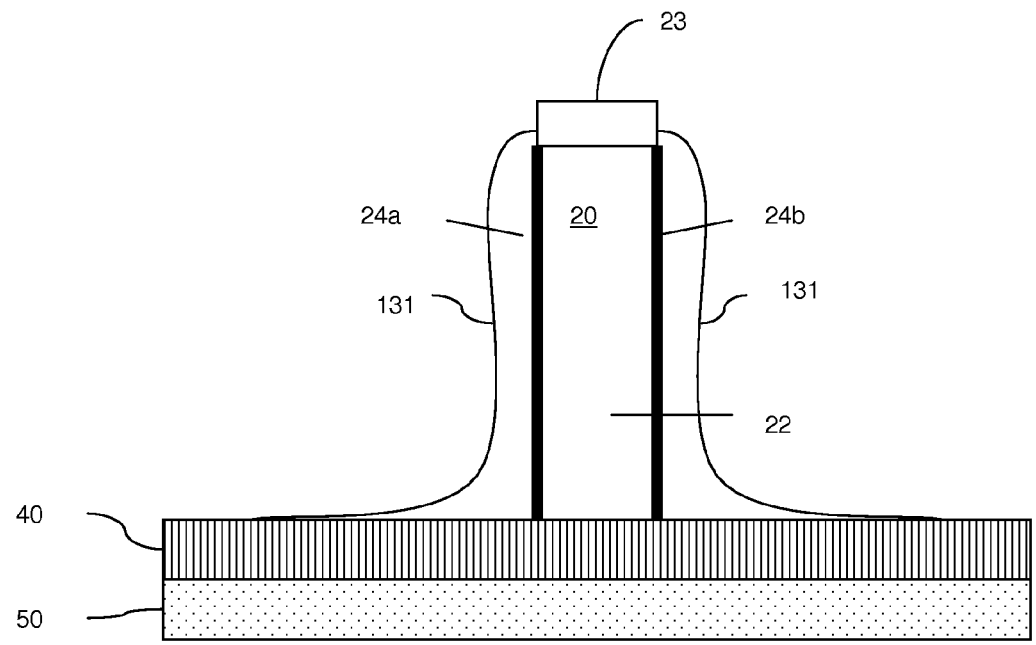
FIG. 5 is a schematic cross-sectional view diagram of a partially completed FinFET.
Figure 6:
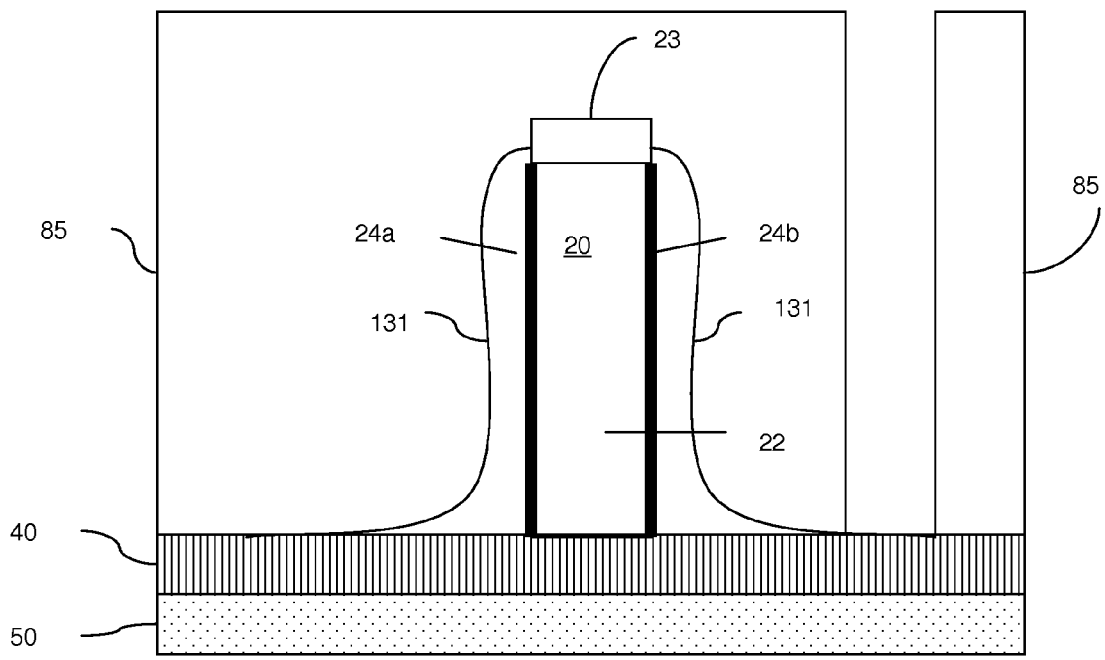
FIG. 6 is a schematic cross-sectional view diagram of a partially completed FinFET.
Figure 7:
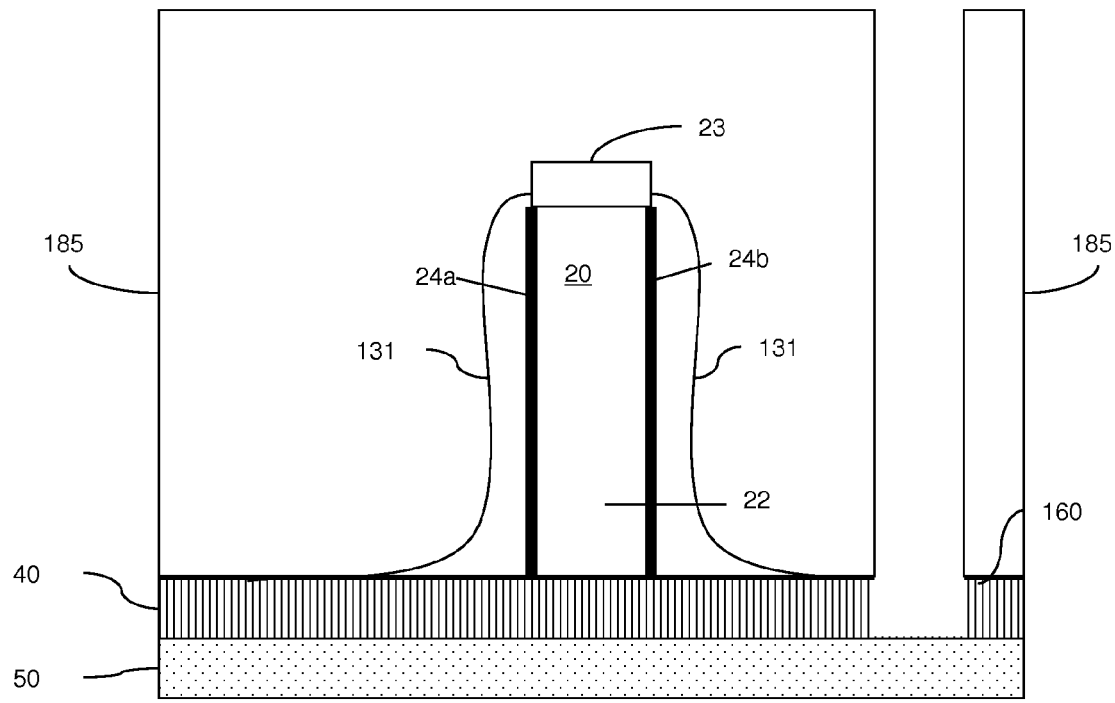
FIG. 7 is a schematic cross-sectional view diagram of a partially completed FinFET.
Figure 8:
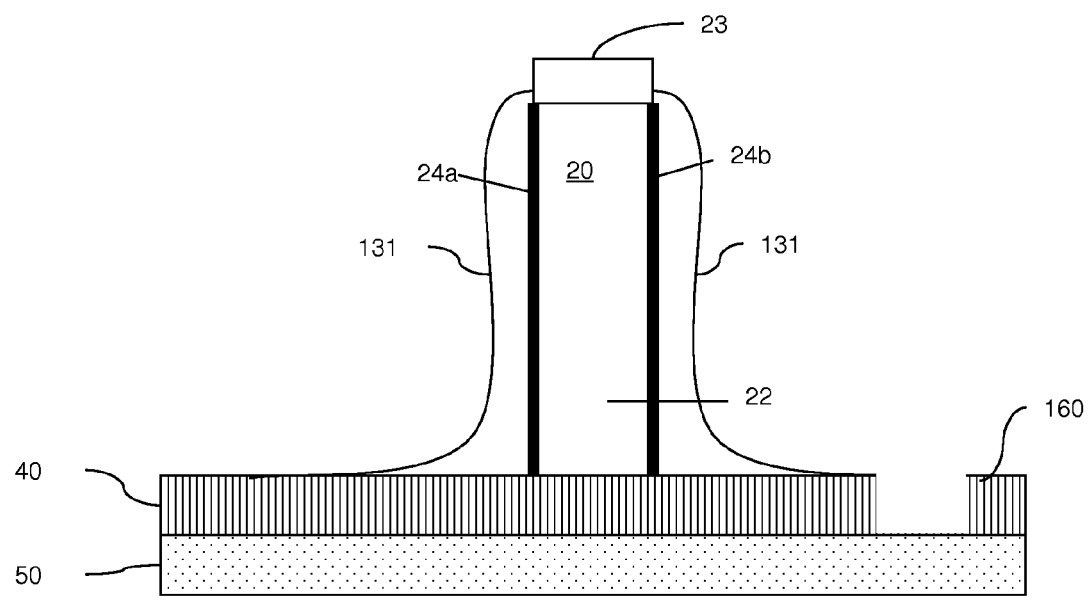
FIG. 8 is a schematic cross-sectional view diagram of a partially completed FinFET.
Figure 9:
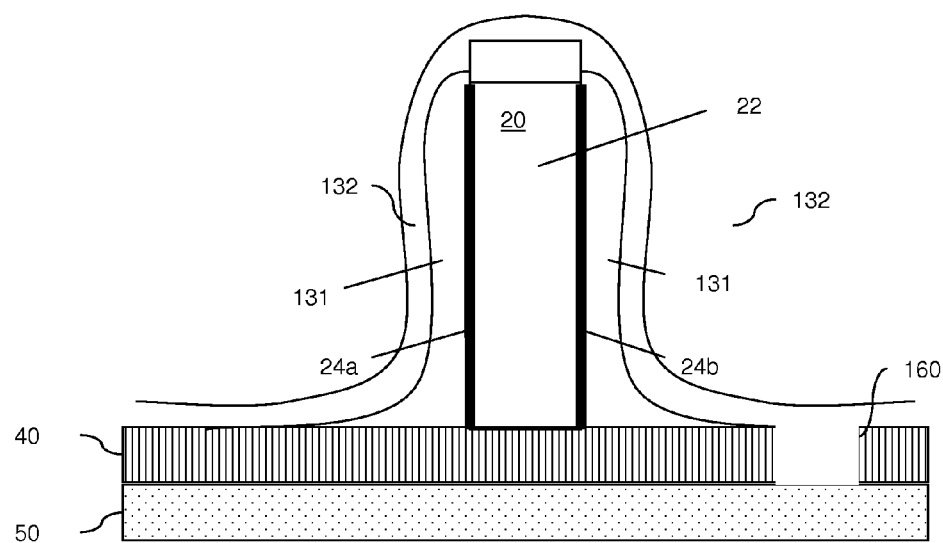
FIG. 9 is a schematic cross-sectional view diagram of a partially completed FinFET.
Figure 10:
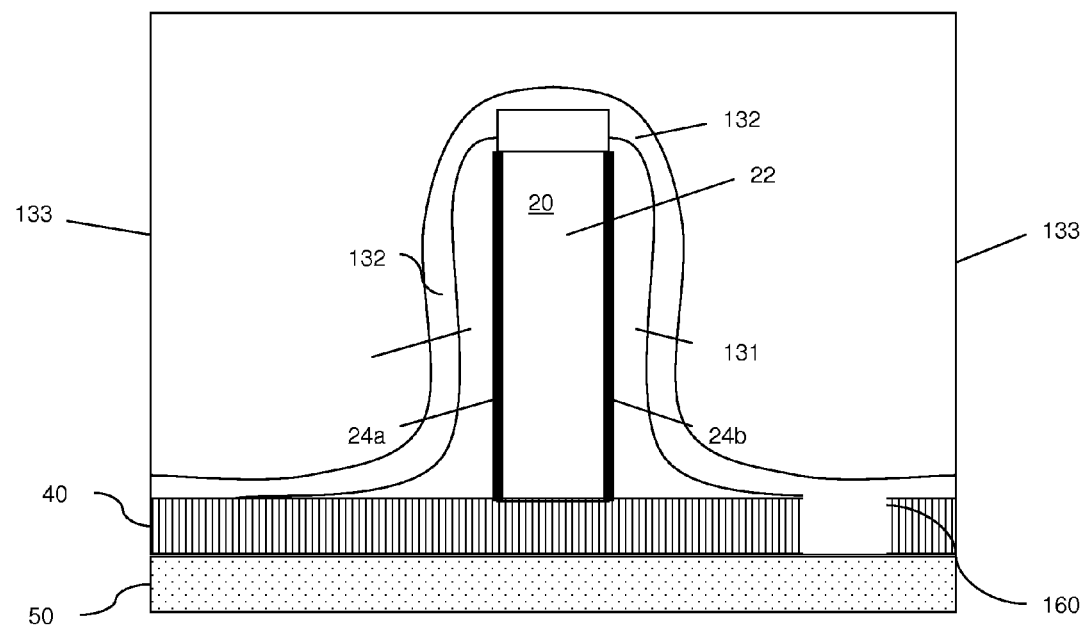
FIG. 10 is a schematic cross-sectional view diagram of a partially completed FinFET.
Figure 11:
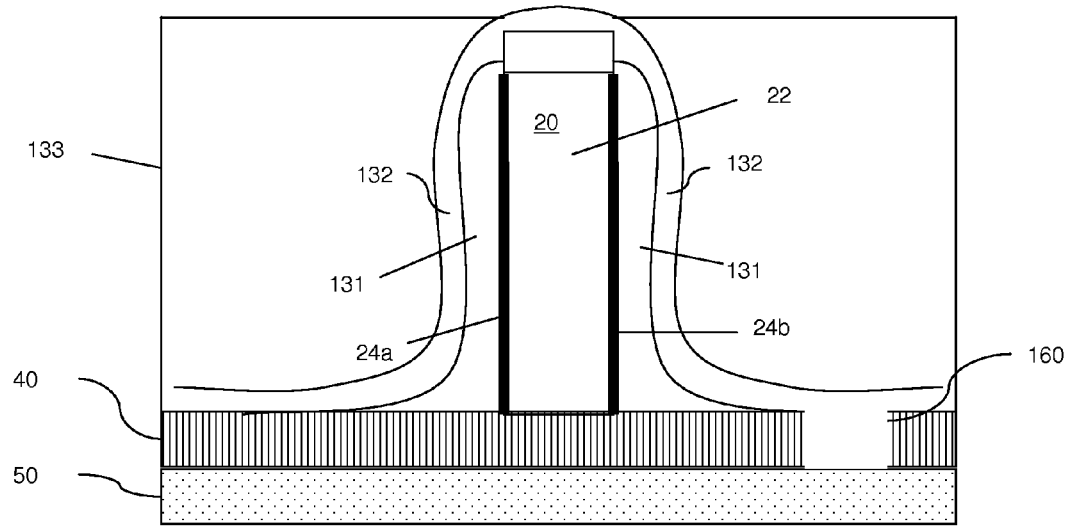
FIG. 11 is a schematic cross-sectional view diagram of a partially completed FinFET.
Figure 12:
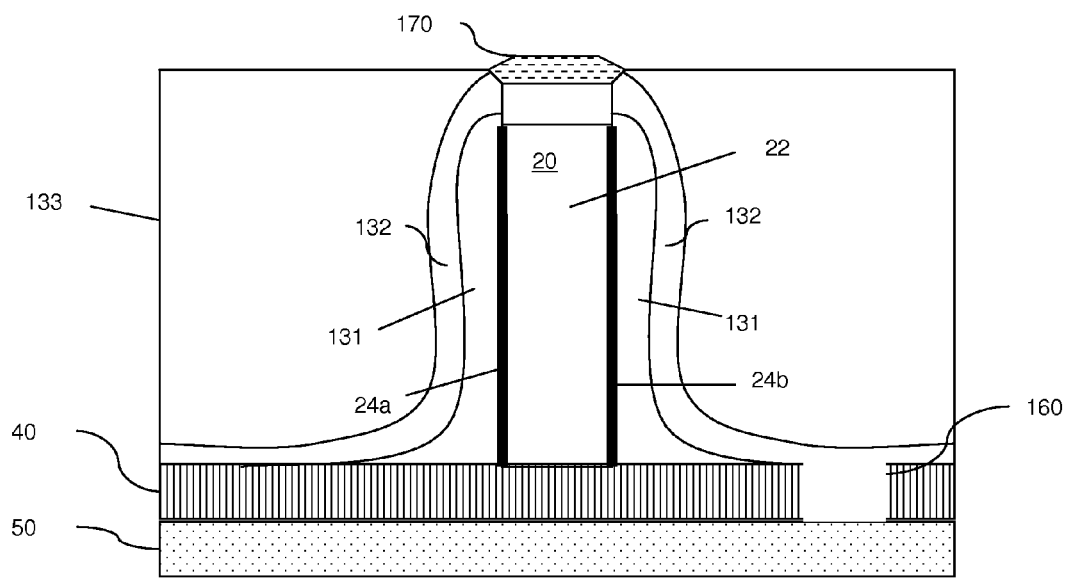
FIG. 12 is a schematic cross-sectional view diagram of a partially completed FinFET.
Figure 13:
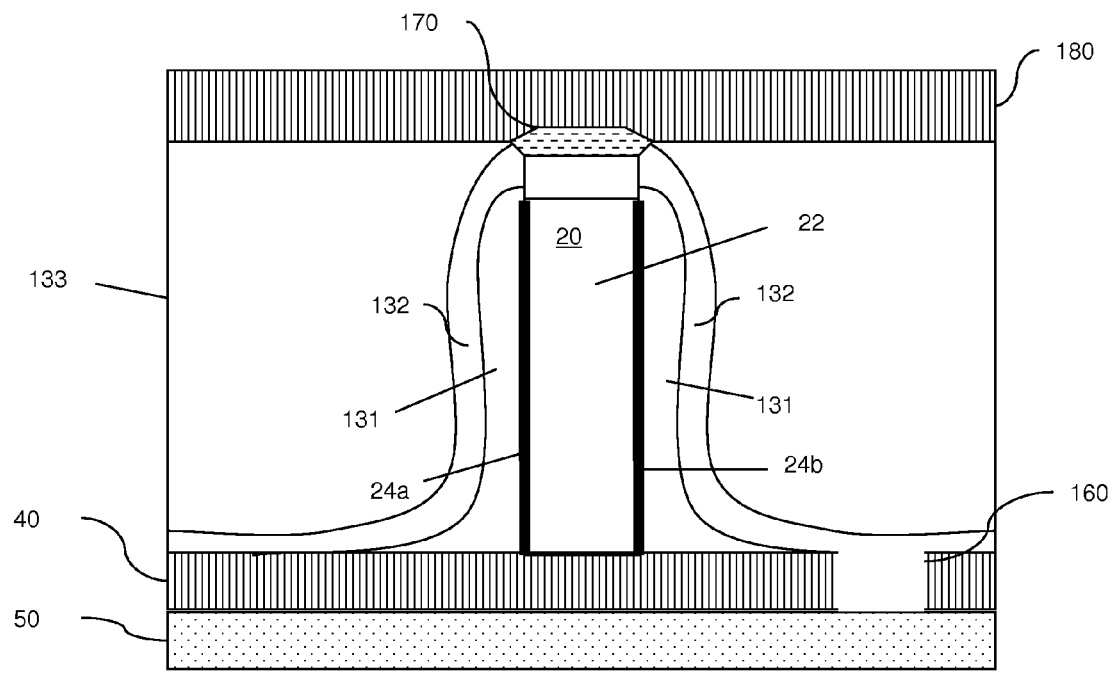
FIG. 13 is a schematic cross-sectional view diagram of a partially completed FinFET.

Referring to FIGS. 1-2 in combination, the basic FinFET structure 10 comprises a silicon fin 20 having a source region on one end 21a, a central channel region 22, and a drain region on the opposite end 21b. The fin 20 further comprises two opposing sidewalls 25 (i.e., a first sidewall and a second sidewall), extending from end to end and a top side 26. The sidewalls 25 both comprise a gate dielectric coating 24 (e.g., thermally grown or deposited $SiO_2$, silicon nitride, a high dielectric constant material, dielectric insulator suitable for use as a gate dielectric, etc.) on portions corresponding to the central channel region 22 of the fin 20. The top side 26 can comprise an insulating fin mask (e.g., $SiO_2$) material 23 retained during the formation of the fin 20. A gate 30 covers the fin 20 over the gate dielectric 24. The gate 30 can comprise a suitable conductive material, such as poly-silicon, silicon germanium, a refractory metal or compounds, etc. Gates 30 on either side of the fin 20 are in contact above the fin 20 and are therefore not isolated and can not be independently controlled. The fin 20 is positioned over a buried oxide (BOX) layer 40 on top of a substrate layer 50.

The completed double-gated FinFET structures (100a, 100b, 200a and 200b) of the present invention are illustrated in FIGS. 14, 17, 27 and 30 respectively.

Figure 14:
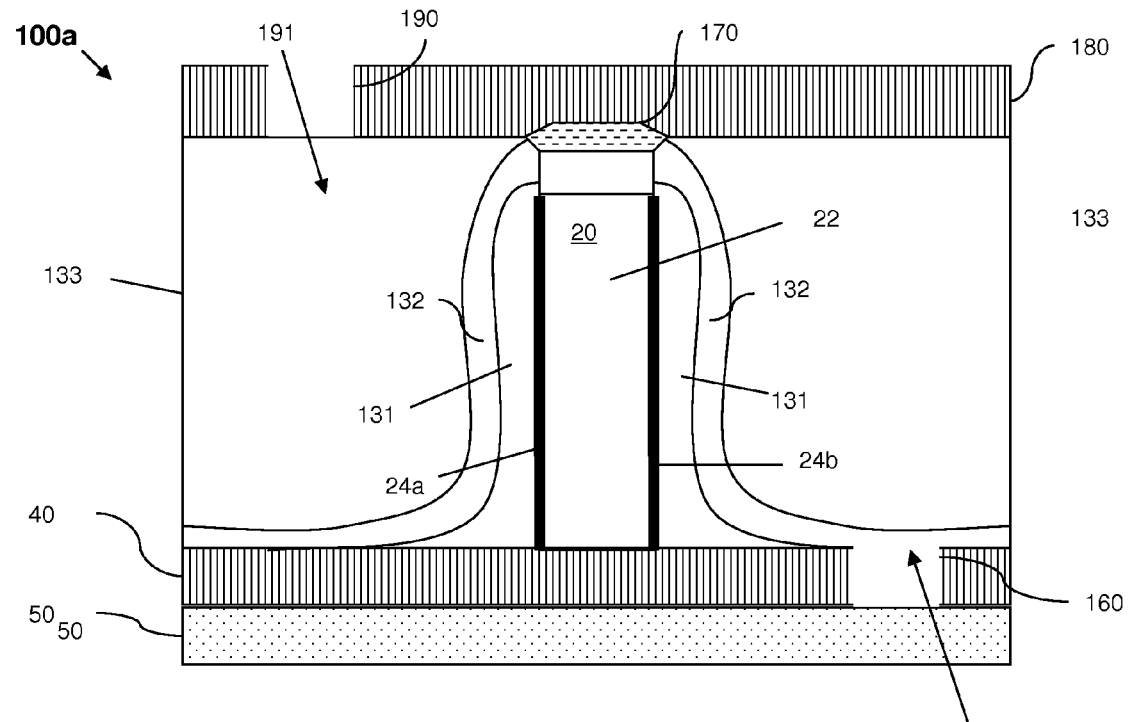
FIG. 14 is a schematic cross-sectional view diagram of a completed double-gated FinFET structure having isolated gates.
Figure 15:
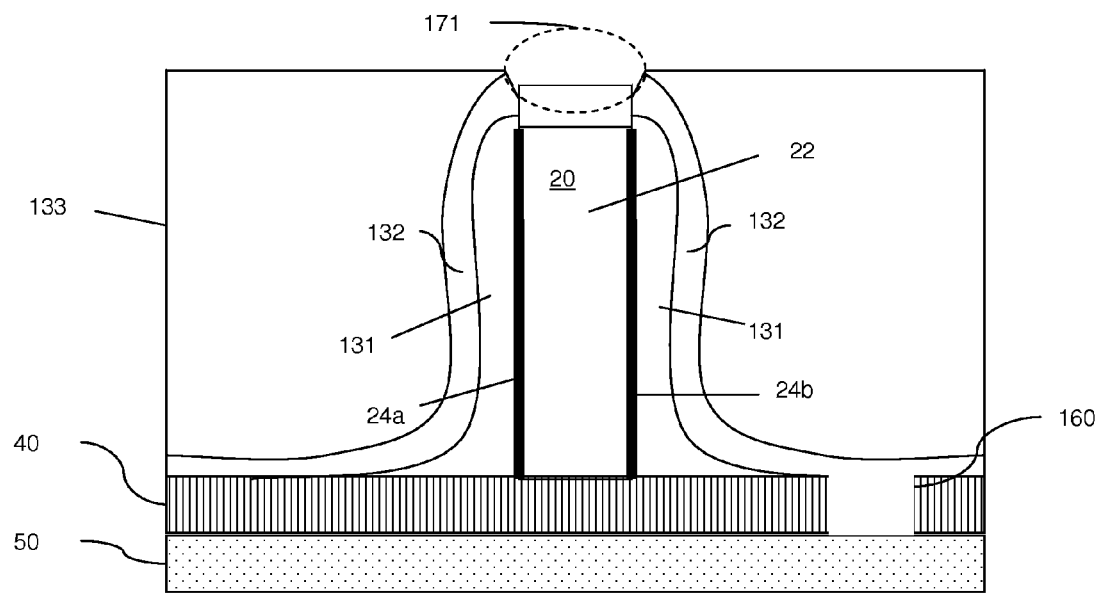
FIG. 15 is a schematic cross-sectional view diagram of a partially completed FinFET.
Figure 16:
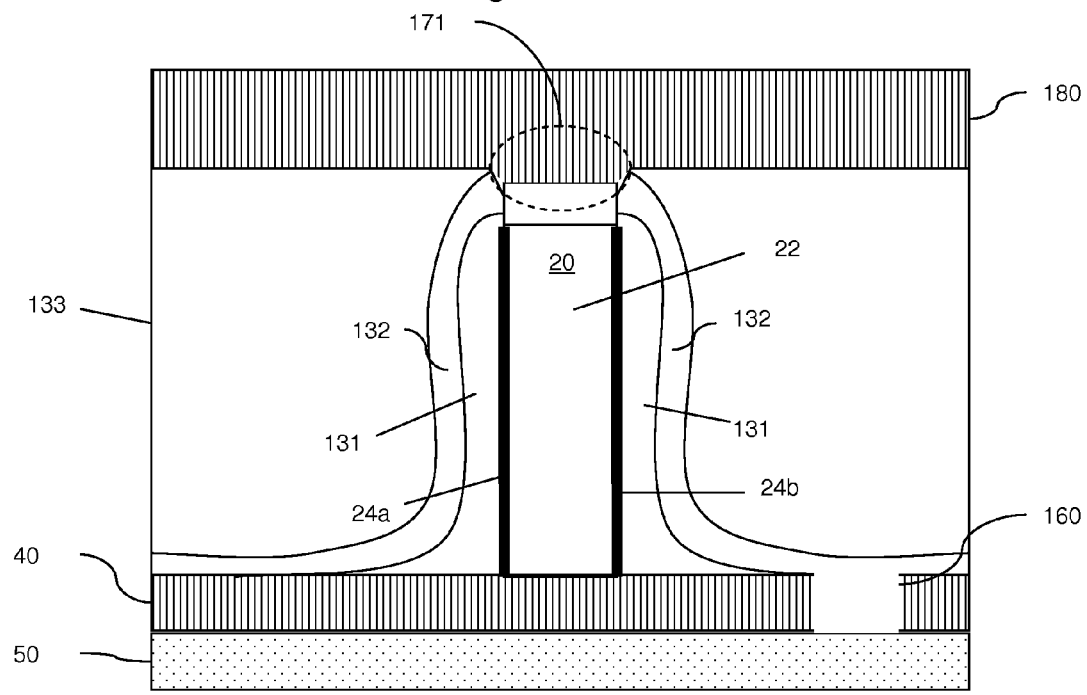
FIG. 16 is a schematic cross-sectional view diagram of a partially completed FinFET.
Figure 17:
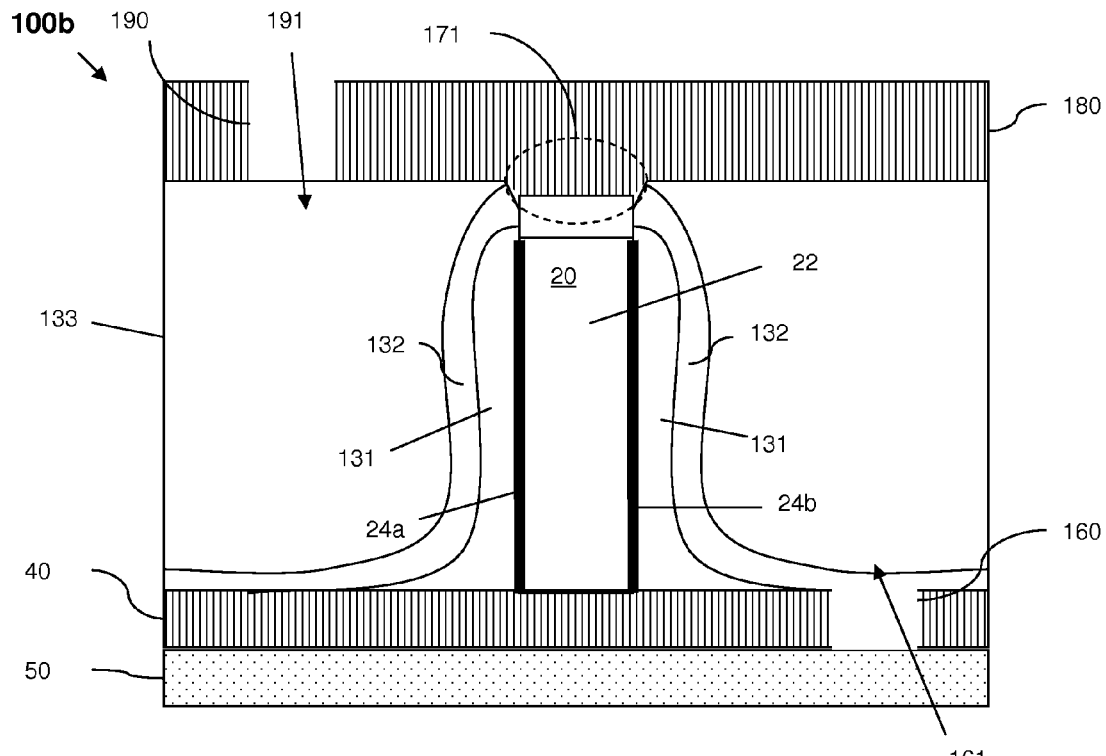
FIG. 17 is a schematic cross-sectional view diagram of a completed double-gated FinFET structure having isolated gates.
Figure 18:
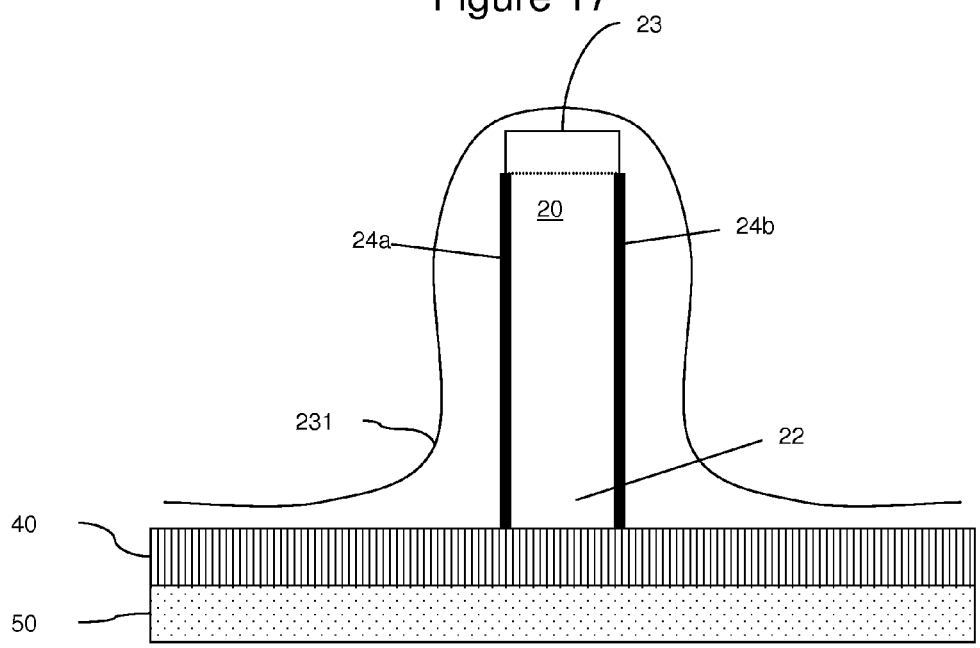
FIG. 18 is a schematic cross-sectional view diagram of a partially completed FinFET.
Figure 19:
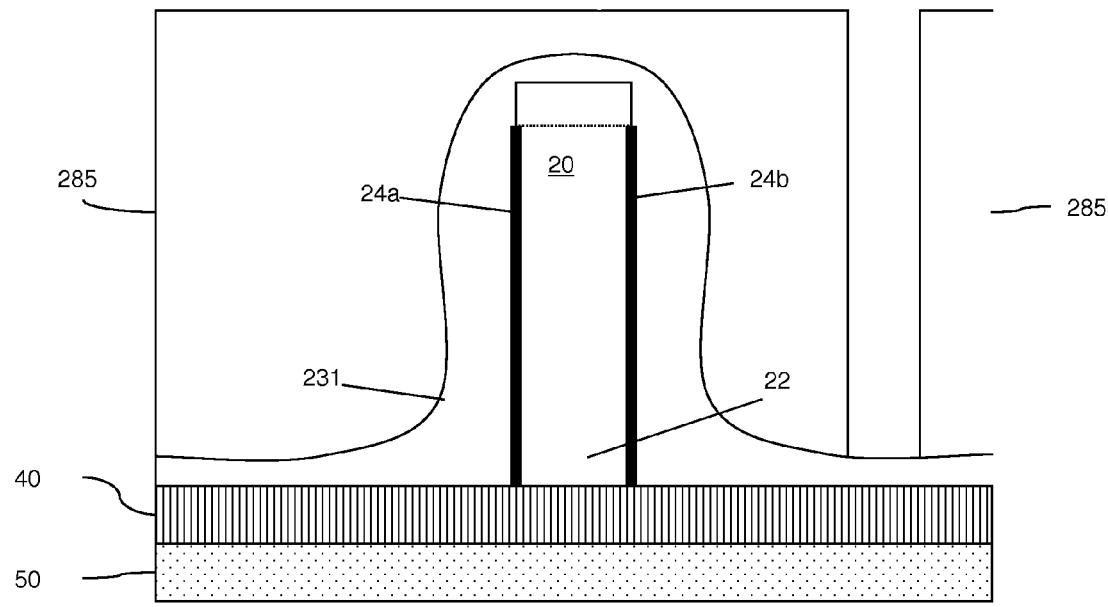
FIG. 19 is a schematic cross-sectional view diagram of a partially completed FinFET.
Figure 20:
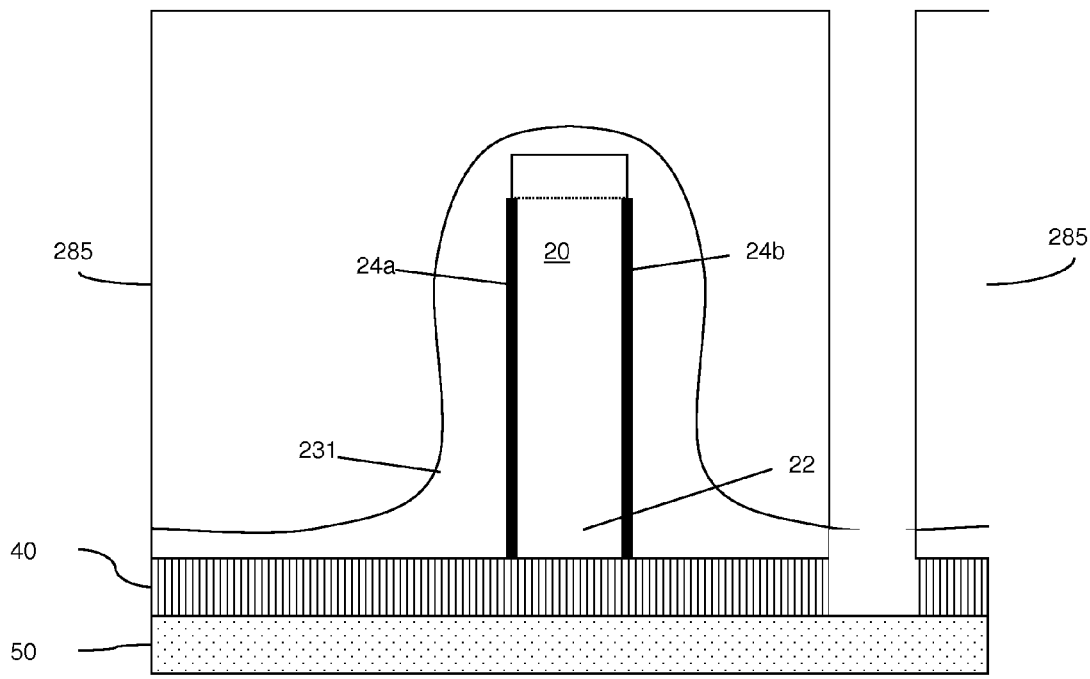
FIG. 20 is a schematic cross-sectional view diagram of a partially completed FinFET.
Figure 21:
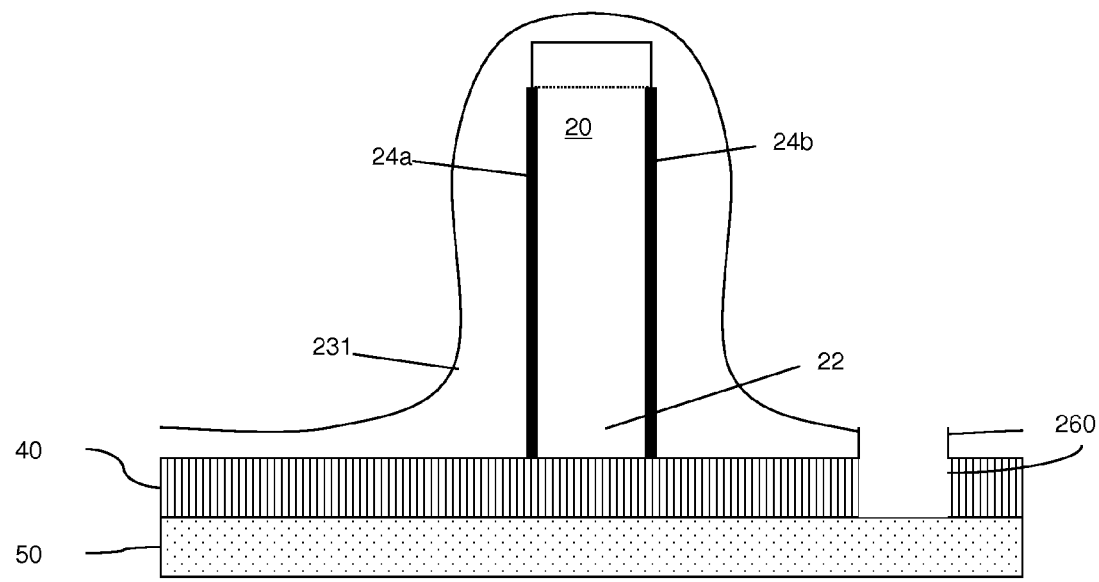
FIG. 21 is a schematic cross-sectional view diagram of a partially completed FinFET.
Figure 22:
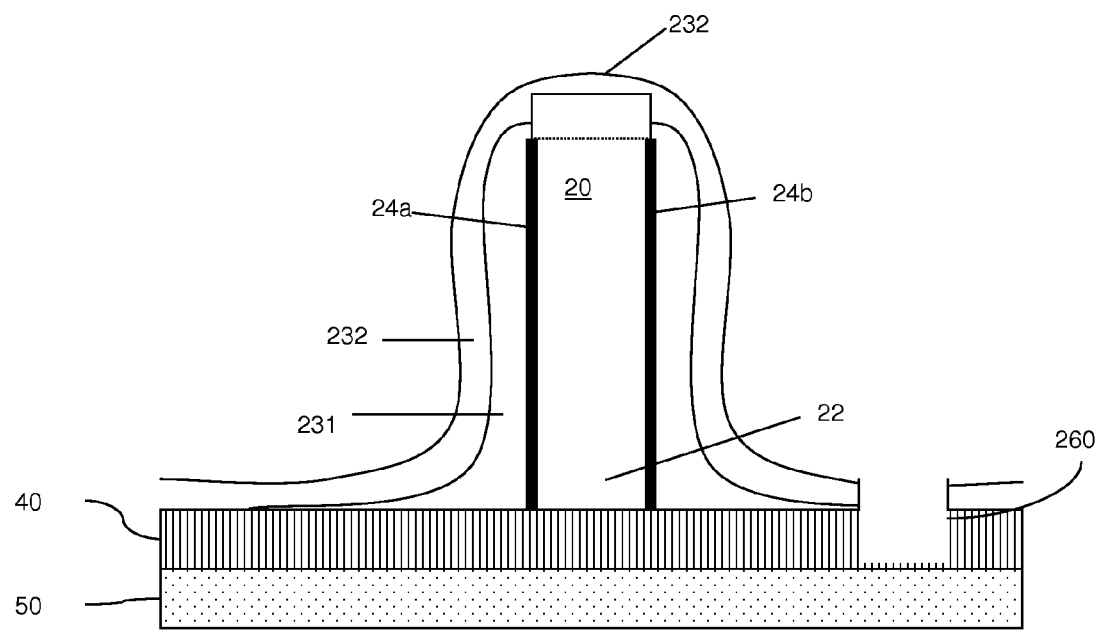
FIG. 22 is a schematic cross-sectional view diagram of a partially completed FinFET.
Figure 23:
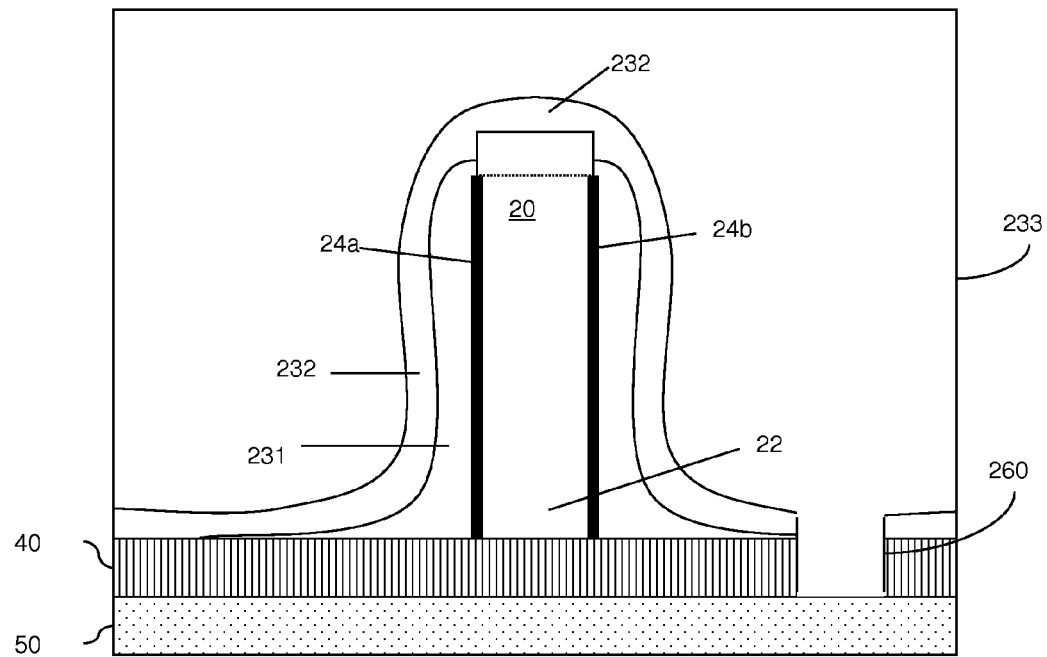
FIG. 23 is a schematic cross-sectional view diagram of a partially completed FinFET.
Figure 24:
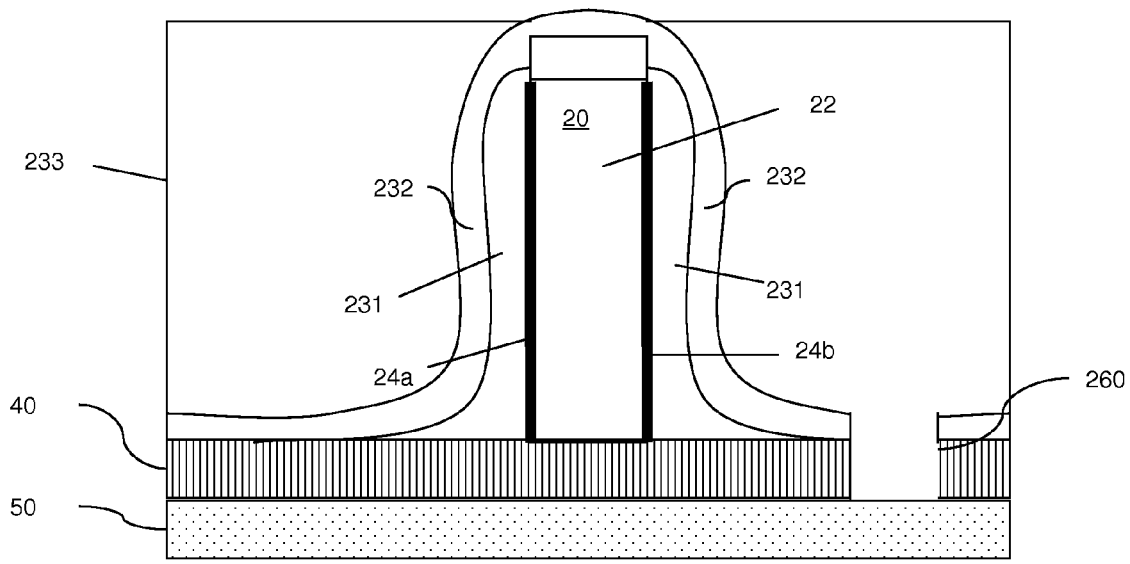
FIG. 24 is a schematic cross-sectional view diagram of a partially completed FinFET.
Figure 25:
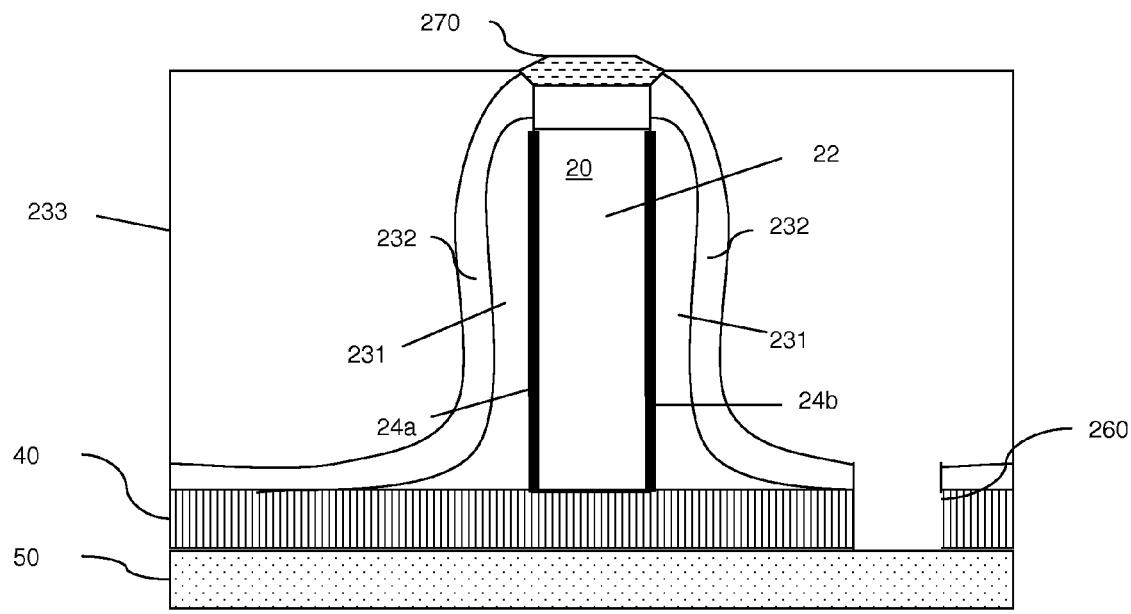
FIG. 25 is a schematic cross-sectional view diagram of a partially completed FinFET.
Figure 26:
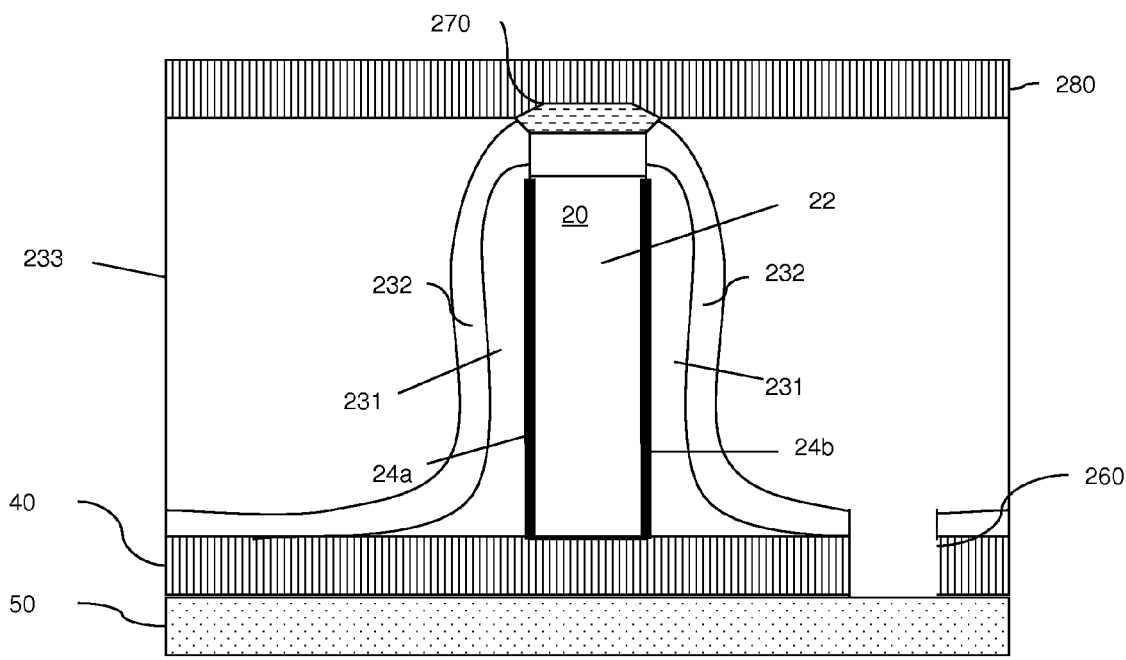
FIG. 26 is a schematic cross-sectional view diagram of a partially completed FinFET.

In one embodiment of the structure of the present invention, as shown in FIGS. 14 and 17, FinFETs 100a and 100b comprise independently controllable first gate conductors 191 over the gate dielectric 24a of the first sidewall of the fin 20 in an area corresponding to the central channel region 22. FinFETs 100a and 100b (see FIGS. 14 and 17, respectively) also comprise independently controllable second gate conductors 161 over the gate dielectric 24b on the second sidewall of the fin 20 in an area corresponding to the central channel region 22. An insulator, illustrated by Ref. No. 170 of FIG. 14 or Ref. No. 171 of FIG. 17, depending upon the method of manufacture and discussed in greater detail below, is above the fin 20 over an area corresponding to the central channel region 22. The insulator 170, 171 electrically separates the first gate conductor 191 from the second gate conductor 161. An insulating layer 180 (e.g., silicon oxide, silicon nitride, a low dielectric constant material, or other suitable insulator) covers the gate conductors 191 and 161 as well as the insulator 170, 171.

Both the first and second gate conductors 191, 161 of this embodiment comprise multiple symmetric layers of conductive material (e.g., 131, 132, and 133). The insulator 170, 171 comprises a portion of one of or more of the multiple layers of conductive material (e.g., 131, 132, and 133) and is positioned over the fin 20 in the area corresponding to the channel region 22. The multiple layers of conductive material for both the first and second gate conductors 191, 161 comprise three symmetric conductive layers (e.g., 131, 132, and 133). One conductive layer 131 (i.e., first conductive layer) can be a conductive sidewall spacer that is positioned on the gate dielectric 24a-b on both sidewalls of the fin 20. The first conductive layer can be formed from a poly-silicon, silicon-germanium, a refractory metal or compound, or other suitable conductive material. Another conductive layer 132 (i.e., second conductive layer) can be deposited over the fin 20 and on the conductive sidewall spacer 131. This second conductive layer 132 can be formed from a conductive material capable of being converted into an insulating material, such as Silicon Germanium (SiGe). An third conductive layer 133 formed from a conductive material such as a poly-silicon, silicon-germanium, a refractory metal or compound, or other suitable conductive material, is deposited over the second conductive layer 132.

As stated above, the insulator 170 or 171 is positioned above the fin 20 in an area corresponding to the central channel region. The insulator 170, 171 comprises a portion of the multiple layers of conductive layers. In one structure illustrated in FIG. 14, the insulator 170 comprises a portion of the second conductive layer 132 that is located directly above the fin 20. This portion of the second conductive layer (e.g., SiGe) is oxidized and thereby converted into an insulating material to create insulator 170. Alternatively, in another structure illustrated in FIG. 17, the insulator 171 can comprise adjacent portions of the first gate conductor 191 and second gate conductor 161 that are removed from above the fin 20 and filled in with an insulating material. The insulator 171 can be formed as the insulating layer 180 is deposited over the third conductive layer 133 and fills in the space corresponding to the removed portions of the first and second gate conductors 191, 161 above the fin 20 or it can be formed from a different insulating material deposited prior to forming the insulating layer 180 above the third conductive layer 133 and insulator 171.

The insulating layer 180 above the third conductive layer 133 in an area corresponding to the first gate 191 comprises a gate contact opening 190. The buried oxide (BOX) layer 40 below the second gate 161 comprises a gate contact opening 160. These gate contact openings 190, 160 are used to independently control the isolated gates 191, 161.

Figure 27:
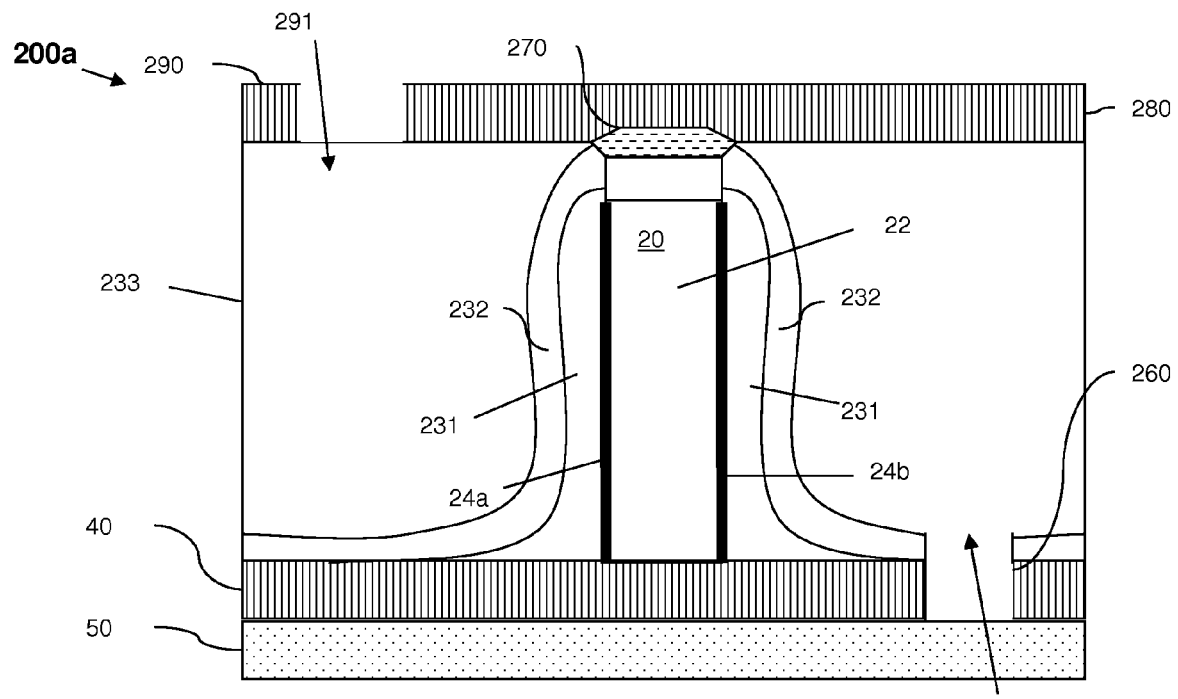
FIG. 27 is a schematic cross-sectional view diagram of a completed double-gated FinFET structure having isolated gates.
Figure 28:
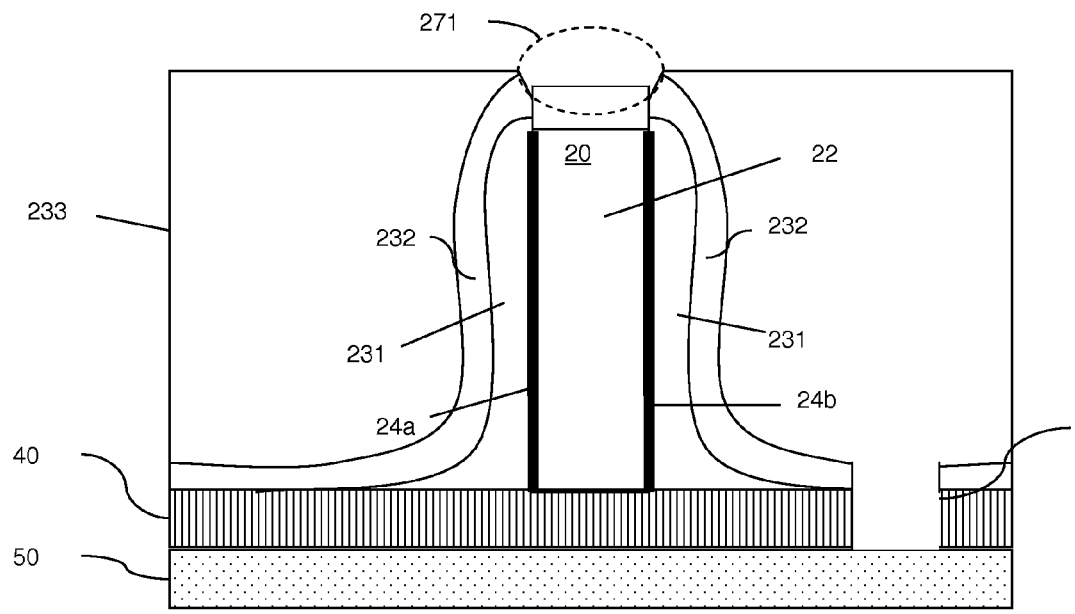
FIG. 28 is a schematic cross-sectional view diagram of a partially completed FinFET.
Figure 29:
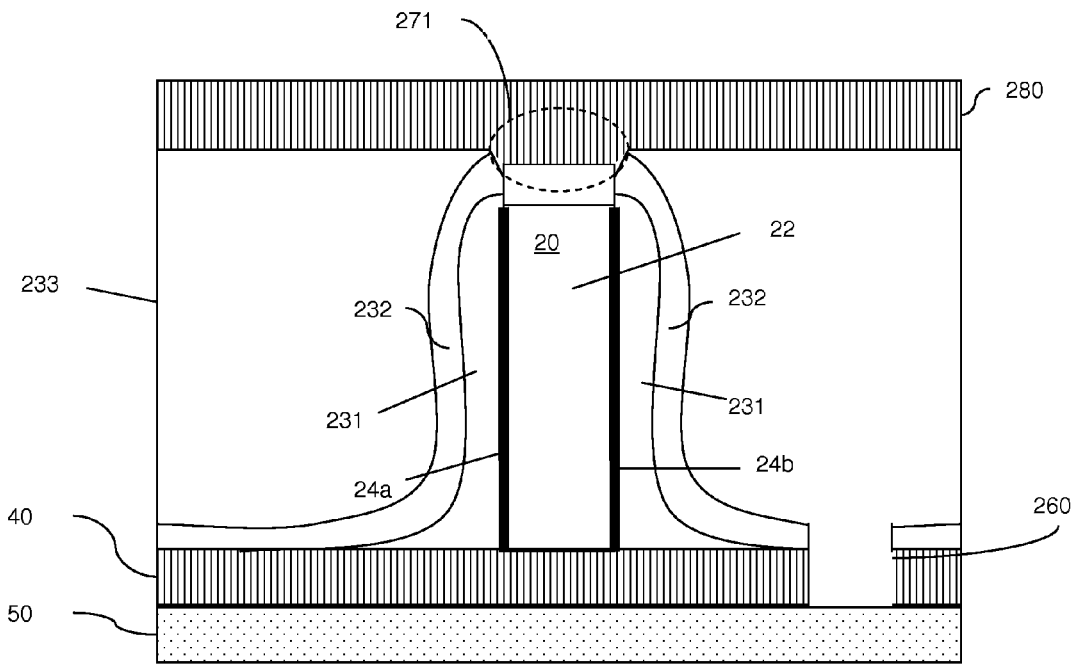
FIG. 29 is a schematic cross-sectional view diagram of a partially completed FinFET.
Figure 30:
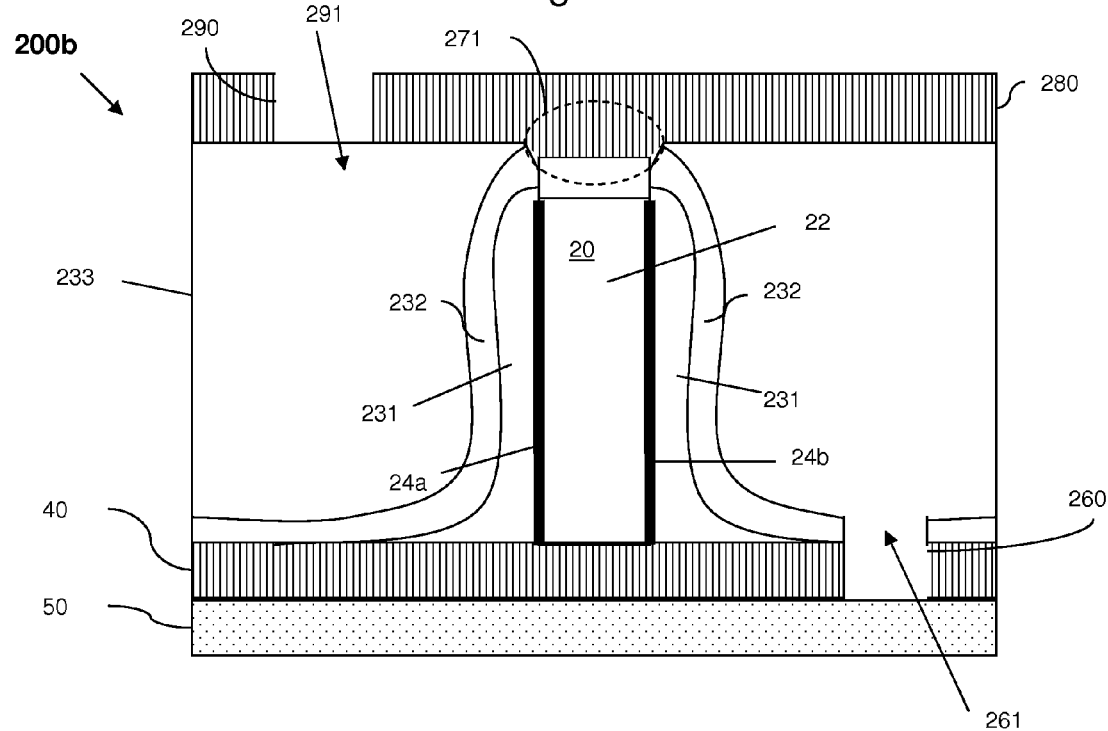
FIG. 30 is a schematic cross-sectional view diagram of a completed double-gated FinFET having isolated gates.

In another embodiment of the present invention, as shown in to FIGS. 27 and 30, FinFETs 200a and 200b comprise independently controllable first gate conductors 291 over the gate dielectric 24a of the first sidewall of the fin 20 in an area corresponding to the central channel region 22. FinFETs 200a and 200b (see FIGS. 27 and 30, respectively) also comprise independently controllable second gate conductors 261 over the gate dielectric 24b on the second sidewall of the fin 20 in an area corresponding to the central channel region 22. An insulator, illustrated by Ref. No. 270 of FIG. 27 or Ref. No. 271 of FIG. 30, depending upon the method of manufacture and discussed in greater detail below, is above the fin 20 over an area corresponding to the central channel region 22. The insulator 270, 271 electrically separates the first gate conductor 291 from the second gate conductor 261. An insulating layer 280 covers the gate conductors 291 and 261 as well as the insulator 270, 271.

Both the first and second gate conductors 291, 261 of this embodiment of the present invention comprise multiple symmetric layers of conductive material. The insulator 270, 271 comprises a portion of one of or more of the multiple layers of conductive material and is positioned over the fin 20 in the area corresponding to the channel region 22. The multiple layers of conductive material for both the first and second gate conductors 291, 261 comprise two symmetric conductive layers (e.g., 231 and 233). One conductive layer 231 (i.e., first conductive layer) can be a poly-silicon conductive sidewall spacer positioned both on the gate dielectric 24a-b on both sidewalls of the fin 20 and over the top of the fin 20. This first poly-silicon conductive layer 231 can be implanted with a dopant (e.g., germanium, boron, arsenic, etc.) to enhance the oxidation rates of the top surface of the first conductive layer 231 and, specifically, to enhance the rate at which the entire portion of the first conductive layer 231 located over the top side of the fin 20 is oxidized. Thus, implanting the top surface 232 of the first conductive layer 231 effectively creates another conductive layer that is capable of being converted into an insulating material. A second conductive layer 233 formed from a conductive material such as, a poly-silicon, silicon-germanium, a refractory metal or compound, or other suitable conductive material, is deposited over the implanted top surface 232 of the first conductive layer 231.

As stated above, the insulator 270 or 271 is positioned above the fin 20 in an area corresponding to the central channel region. The insulator 270, 271 comprises a portion of the multiple layers of conductive materials. In one structure illustrated in FIG. 27, the insulator 270 comprises a portion of the first conductive layer 231 located directly above the fin 20. This portion of the first conductive layer over the fin 20 is entirely implanted 232 so that when it is oxidized it is converted into an insulating material to create insulator 270. Alternatively, in another structure illustrated in FIG. 30, the insulator 271 can comprise adjacent portions of the first gate conductor 291 and second gate conductor 261 that are removed from above the fin 20 and filled in with an insulating material. The insulator 271 can be formed as the insulating layer 280 is deposited over the second conductive layer 233 and consequently fills in the space corresponding to the removed portions of the first and second gate conductors 291, 261 above the fin 20 (as illustrated in FIG. 30). The insulator 271 can also be formed from a different insulating material deposited over the space corresponding to the removed portions of the first and second gate conductors prior to forming the insulating layer 280 above the second conductive layer 233 and insulator 271.

The insulating layer 280 above the second conductive layer 233 in an area corresponding to the first gate 291 comprises a gate contact opening 290. The buried oxide (BOX) layer 40 below the second gate 261 comprises a gate contact opening 260. These gate contact openings 290, 260 are used to independently control the isolated gates 291, 261.

Figure 31:
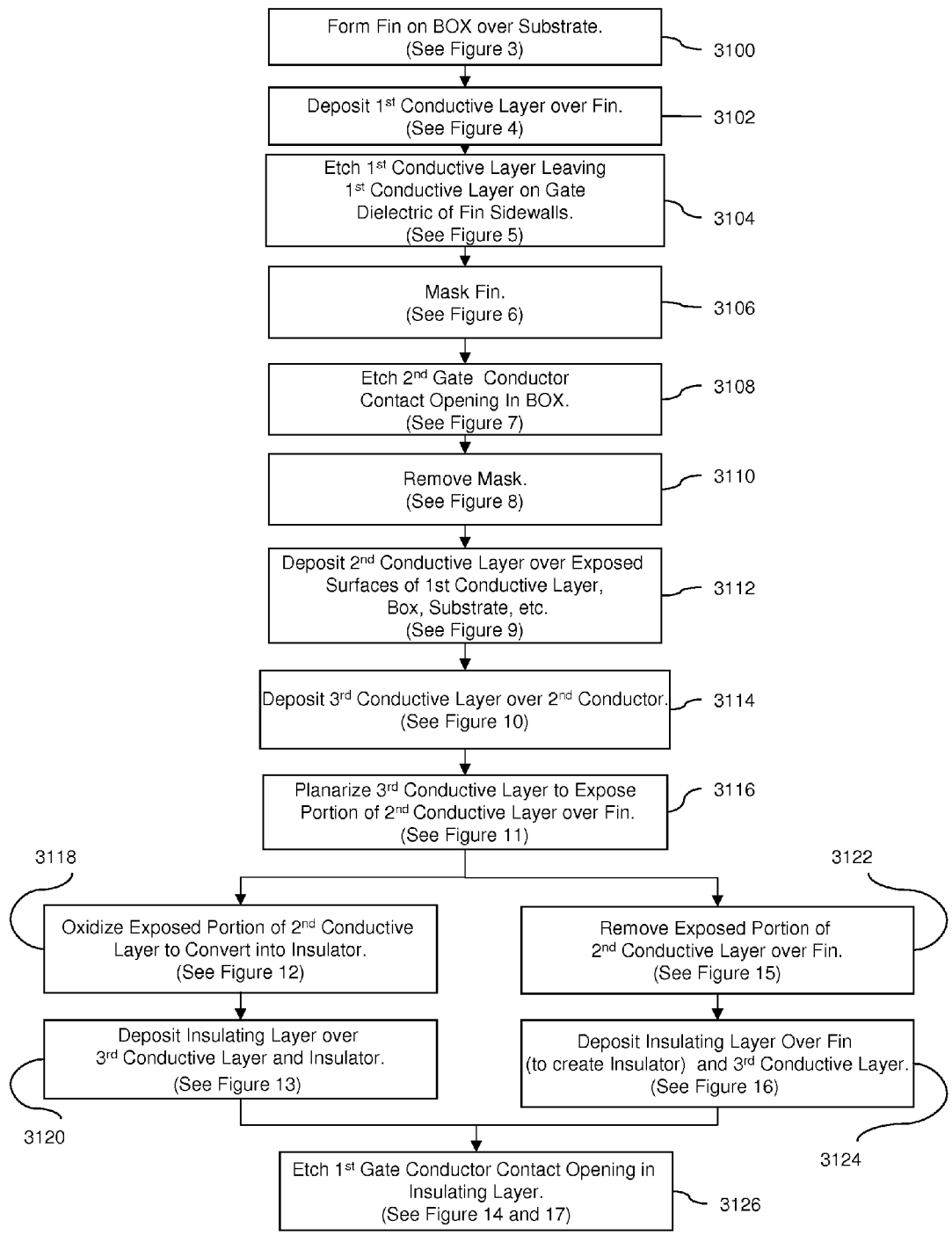
FIG. 31 is flow diagram illustrating a method of the invention.
Figure 32:
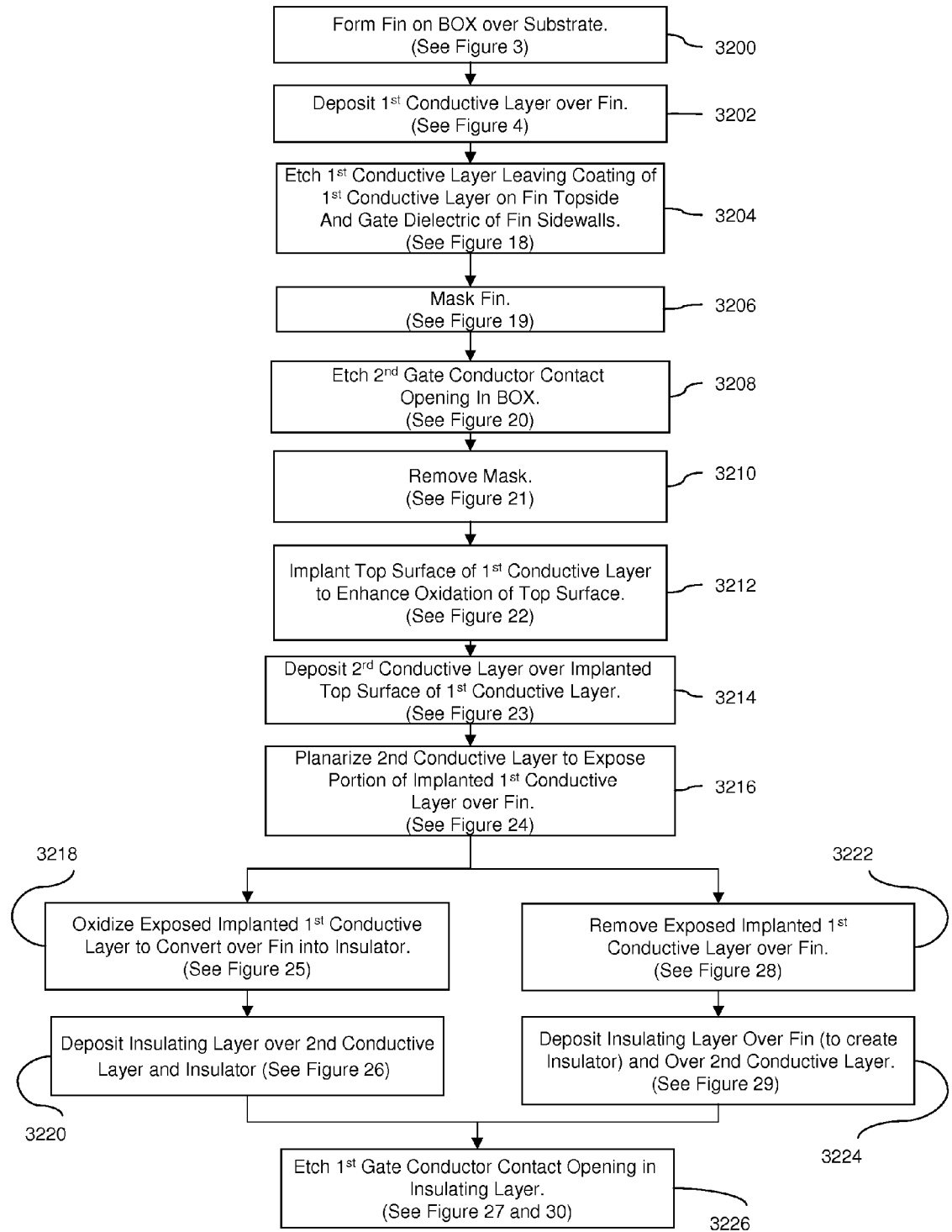
FIG. 32 is a flow diagram illustrating another method of the invention.

FIGS. 31-32 are flow diagrams illustrating the embodiments of the method of the present invention for manufacturing a double-gated FinFET, having isolated independent gates. In both embodiments, a fin is formed on silicon-on-insulator (SOI) wafers in which each wafer is comprised of a buried oxide (BOX) layer on top of a substrate 3100, 3200. For example, a mask for a silicon fin etch can be formed and then a fin can be etched using reactive ion etching. The fin can comprise a central channel region, end portions (source and drain regions), opposing sidewalls (first and second sidewalls) and a top side. The top side of the fin can comprise an insulating fin mask (e.g., $SiO_2$) material retained during the etching of the fin. A sacrificial $SiO_2$ layer can be grown and removed to repair damage to the fin sidewalls during fin etching. Portions of the first and second sidewalls of the fin can also be coated with a gate dielectric. The gate dielectric can be thermally grown or deposited $SiO_2$, silicon nitride, a high dielectric constant material, dielectric insulator suitable for use as a gate dielectric, etc.

Referring to FIG. 31, in one embodiment a first conductive layer is formed. The first conductive layer can be formed as a spacer on the sidewalls of the fin by depositing a conductive material over the fin 3102. This conductive material for the first conductive layer can be a poly-silicon, silicon-germanium, a refractory metal or compound, or other suitable conductive material. Then using a selective or spacer etching process, some of the first conductive layer is removed leaving the first conductive layer only on the first and second sidewalls of the fin over the gate dielectric 3104. A second gate conductor contact opening is then etched into the BOX layer on which the fin is positioned. This is accomplished by depositing a hard mask over the fin 3106. Then using a spacer etching process, the gate opening is etched into BOX 3108 and the mask is removed 3110.

After the second gate conductor contact opening is etched into the BOX 3108 and the mask is removed 3110, a thin second conductive layer is formed over the fin and the first conductive layer 3112. Specifically, a conductive material that is capable of being converted into an insulator by oxidizing the conductive material (e.g., SiGe, any other suitable conductive material having an enhanced oxidation rate, etc.) is deposited over any exposed surfaces of the first conductive layer, the BOX, and the substrate. The conductive material used for the second conductive layer can be a different conductive material from that of the first conductive layer.

A third conductive layer (e.g., poly-silicon) is then deposited over the second conductive layer 3114. The third conductive layer is planarized to expose that portion of the second conductive layer that is above the fin 3116. The planarization process can be accomplished using chemical-mechanical polishing (CMP). This exposed portion of the second conductive layer is then changed into an insulator. The process of converting the exposed portion of the second conductive layer into an insulator can be accomplished in a number of ways. For example, one process comprises oxidizing the exposed portion of the second conductive layer 3118, for example, by using a thermal oxidation process (e.g., low pressure oxidation, high pressure oxidation, etc.). Oxidizing this portion of the second conductive layer creates a partition of insulating material (i.e., insulator) above the fin that effectively isolates the first gate conductor from the second gate conductor. Once the insulator is formed, a layer of insulating material (e.g., silicon oxide, silicon nitride, a low dielectric constant material, or other suitable insulator) is deposited over the $3^{rd}$ conductive layer and the insulator 3120. Alternatively, that portion of the second conductive layer that is above the fin can be converted into an insulator by first selectively removing the exposed portion of the second conductive layer 3122 and then filling in the resulting space with an insulating material. The resulting space can be filled in as an insulating layer is deposited over the third conductive layer 3124. It can also be filled in using a different insulating material to form the insulator and then both the insulator and the $3^{rd}$ conductor can be coated with another insulating material. Removing the conductive material above the fin and replacing it with an insulating material effectively forms a partition (i.e., isolator) that electrically isolates the first gate conductor from the second gate conductor. Lastly, a first gate conductor contact opening is etched into the insulating layer above the first gate conductor, for example, by using a selective etching process 3126.

Alternatively, referring to FIG. 32, in another embodiment a first conductive layer is formed. The first conductive layer can be formed as a spacer on the sidewalls of the fin by depositing a poly-silicon conductive material over the fin 3202. Then, using a selective or spacer etching process, some of the poly-silicon first conductive layer is removed leaving a thin coating of the first conductive layer only on the top side of the fin and also a coating of the first conductive layer on the first and second sidewalls of the fin over the gate dielectric and corresponding central channel region 3204. A second gate conductor contact opening is then etched into the BOX layer on which the fin is positioned. This is accomplished by depositing a hard mask over the fin 3206. Then using a spacer etching process, the gate opening is etched into BOX 3208 and the mask is removed 3210.

After the second gate conductor contact opening is etched into the BOX 3208 and the mask is removed 3210, the top surface of the first conductive layer is implanted with a dopant impurity (e.g., germanium, boron, arsenic, etc.) in sufficient concentrations to enhance the oxidation rate of the top surface of the first conductive layer 3212 and, particularly, to enhance the oxidation rate of the entire portion of the first conductive layer located above the fin. Enhancing the oxidation rate of the top surface of the first conductive layer effectively converts the top surface of the first conductive layer into a conductive material that is capable of being converted into an insulator by oxidization. A post-implant anneal may be applied to activate the implanted dopants and to repair implantation damage. Once the implantation process is complete, a second conductive layer (e.g., poly-silicon) is deposited over the implanted top surface of the first conductive layer 3214. The second conductive layer is then planarized to expose that portion of the implanted first conductive layer that is above the fin 3216. The planarization process can be accomplished using chemical-mechanical polishing (CMP). The exposed portion of the implanted first conductive layer is then changed into an insulator. The process of converting the exposed portion of the implanted first conductive layer into an insulator can be accomplished in a number of ways. For example, one process comprises oxidizing the exposed portion of the implanted first conductive layer 3218, for example, by using a thermal oxidation process (e.g., low pressure oxidation, high pressure oxidation, etc.). Oxidizing this portion of the implanted first conductive layer creates a partition of insulating material (i.e., insulator) above the fin that effectively isolates the first gate conductor from the second gate conductor. Once the insulator is formed, a layer of insulating material (e.g., silicon oxide, silicon nitride, a low dielectric constant material, or other suitable insulator) is deposited over the second conductive layer and the insulator 3220. Alternatively, that portion of the implanted first conductive layer that is above the fin can be converted into an insulator by first selectively removing the exposed portion of the implanted first conductive layer 3222 and then filling in the resulting space with an insulating material. The resulting space can be filled in as an insulating layer is deposited over the second conductive layer 3224. It can also be filled in using a different insulating material to form the insulator and then both the insulator and the second conductor can be coated with another insulating material. Removing the conductive material from above the fin and replacing it with an insulating material effectively forms a partition (i.e., isolator) that electrically isolates the first gate conductor from the second gate conductor. Lastly, a first gate conductor contact opening is etched into the insulating layer above the first gate conductor, for example, by using a selective etching process 3226.

Thus, in accordance with the present invention an improved double-gated FinFET structure may be manufactured such that the gates of the double-gated FinFET structure are electrically isolated and can be independently controlled.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

What is claimed is:

1. A method of forming gates on a fin of a fin-type field effect transistor (FinFET), said method comprising:
   forming a first conductive layer on portions of a first sidewall and a second sidewall of said fin;
   forming a second conductive layer over said fin and said first conductive layer;
   depositing a third conductive layer over said second conductive layer;
   planarizing said third conductive layer to expose a portion of said second conductive layer over said fin; and
   changing said exposed portion of said second conductive layer into an insulator.

2. The method of claim 1, wherein forming a second conductive layer over said fin and said first conductive layer comprises:
   further forming said first conductive layer over said fin; and
   implanting an outer surface of said first conductive layer with an impurity in sufficient concentrations to enhance the oxidation rate of said outer surface and thereby create said second conductive layer.

3. The method of claim 1, wherein said process of changing said exposed portion of said second conductive layer into an insulator comprises oxidizing said exposed portion of said second conductive layer.

4. The method of claim 1, wherein said process of changing said exposed portion of said second conductive layer into an insulator comprises selectively removing said exposed portion of said second conductive layer and filling in said removed portions of said second conductive layer with an insulator.

5. The method of claim 1, further comprising after forming said first conductive layer and before forming said second conductive layer, etching a gate contact opening in an insulating layer on which said fin is positioned.

6. A method of forming gates on a fin of a fin-type field effect transistor (FinFET), said method comprising:
   forming a first conductive layer on portions of a first sidewall and a second sidewall of said fin;
   etching a gate contact opening in an insulating layer on which said fin is positioned;
   forming a second conductive layer over said fin and said first conductive layer;
   depositing a third conductive layer over said second conductive layer;
   planarizing said third conductive layer to expose a portion of said second conductive layer over said fin; and
   changing said exposed portion of said second conductive layer into an insulator.

7. The method of claim 6, wherein forming a second conductive layer comprises:
   further forming said first conductive layer over said fin; and
   implanting an outer surface of said first conductive layer with an impurity in sufficient concentrations to enhance the oxidation rate of said outer surface and thereby create said second conductive layer.

8. The method of claim 6, wherein said process of changing said exposed portion of said second conductive layer into an insulator comprises oxidizing said exposed portion of said second conductive layer.

9. The method of claim 6, wherein said method process of changing said exposed portion of said second conductive layer into an insulator comprises selectively removing said exposed portion of said second conductive layer and filling in said removed portions of said second conductive layer with an insulator.

* * * * *